(12) United States Patent
Anderson et al.

(10) Patent No.: US 8,623,719 B2
(45) Date of Patent: Jan. 7, 2014

(54) METHOD FOR FORMING AND STRUCTURE OF A RECESSED SOURCE/DRAIN STRAP FOR A MUGFET

(71) Applicant: International Business Machines Corporation, Armonk, NY (US)

(72) Inventors: Brent A. Anderson, Jericho, VT (US); Andres Bryant, Burlington, VT (US); Edward J. Nowak, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/687,240

(22) Filed: Nov. 28, 2012

(65) Prior Publication Data

US 2013/0122668 A1 May 16, 2013

Related U.S. Application Data

(62) Division of application No. 12/876,343, filed on Sep. 7, 2010, now Pat. No. 8,378,394.

(51) Int. Cl.
*H01L 21/00* (2006.01)

(52) U.S. Cl.
USPC .................................. 438/164; 257/E29.264

(58) Field of Classification Search
USPC .......... 257/288, 347, 298, E29.264, E21.411, 257/E29.255; 438/164
See application file for complete search history.

(56) References Cited

U.S. PATENT DOCUMENTS

| | | | |
|---|---|---|---|
| 6,855,990 B2 | 2/2005 | Hu et al. | |
| 7,172,943 B2 | 2/2007 | Yeo et al. | |
| 7,180,134 B2 | 2/2007 | Yang et al. | |
| 7,262,086 B2 * | 8/2007 | Yeo et al. | 438/149 |
| 7,268,024 B2 | 9/2007 | Yeo et al. | |
| 7,301,206 B2 | 11/2007 | Yeo et al. | |
| 7,425,740 B2 | 9/2008 | Liu et al. | |
| 2005/0275006 A1 | 12/2005 | Tang | |
| 2007/0052027 A1 | 3/2007 | Ke et al. | |
| 2007/0287256 A1 | 12/2007 | Chang et al. | |

OTHER PUBLICATIONS

U.S. Patent Office Communication, U.S. Appl. No. 12/876,343, Dated Aug. 16, 2012, pp. 1-7.
U.S. Patent Office Communication, U.S. Appl. No. 12/876,343, Dated Oct. 9, 2012, pp. 1-7.

* cited by examiner

*Primary Examiner* — Selim Ahmed
(74) *Attorney, Agent, or Firm* — Gibb & Riley, LLC; Richard M. Kotulak, Esq.

(57) ABSTRACT

A method and semiconductor structure includes an insulator layer on a substrate, a plurality of parallel fins above the insulator layer. Each of the fins has a central semiconductor portion and conductive end portions. At least one conductive strap is positioned within the insulator layer below the fins. The conductive strap can be perpendicular to the fins and contact the fins. The conductive strap includes recessed portions disposed within the insulator layer, below the plurality of fins, and between each of the plurality of fins, and projected portions disposed above the insulator layer, collinear with each of the plurality of fins. The conductive strap is disposed in at least one of a source region and a drain region of the semiconductor structure. A gate insulator contacts and covers the central semiconductor portion of the fins, and a gate conductor covers and contacts the gate insulator.

20 Claims, 5 Drawing Sheets

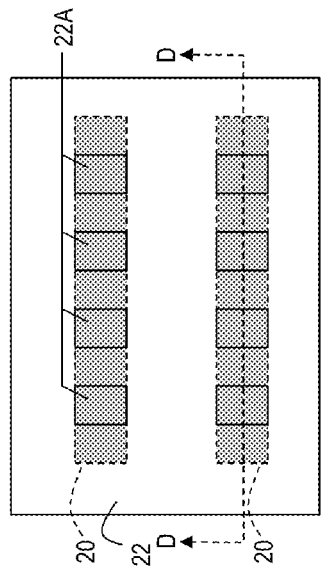
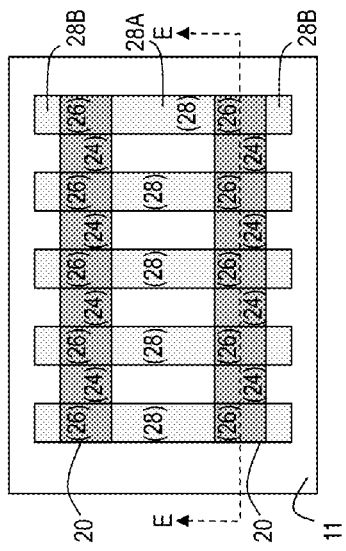
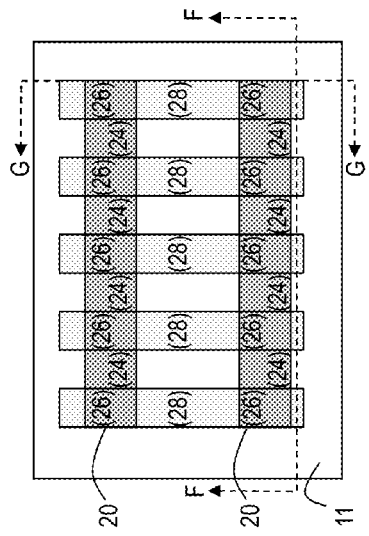
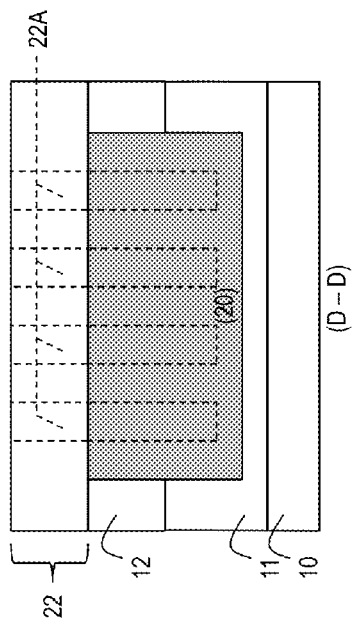
Fig. 4
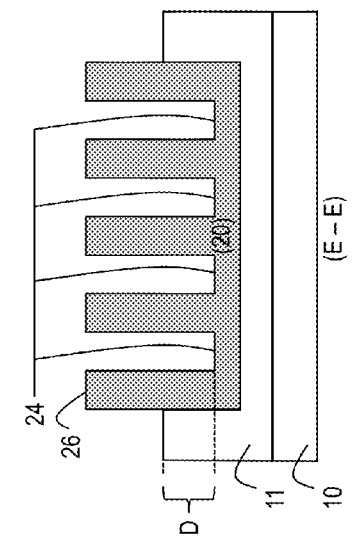
Fig. 5A
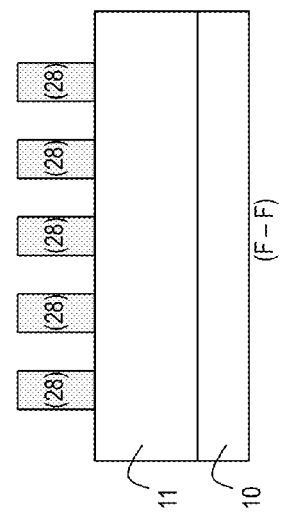
Fig. 5B

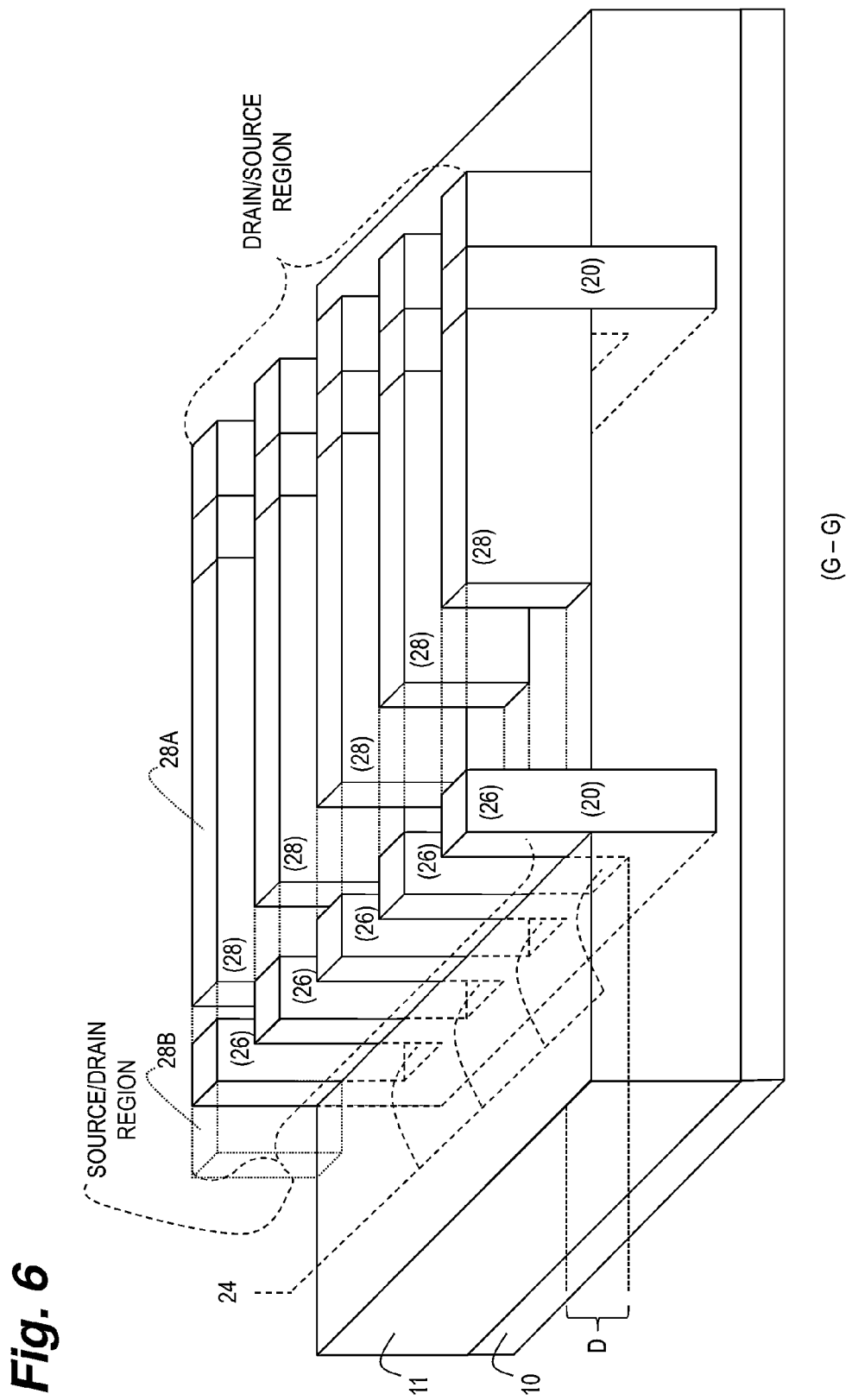

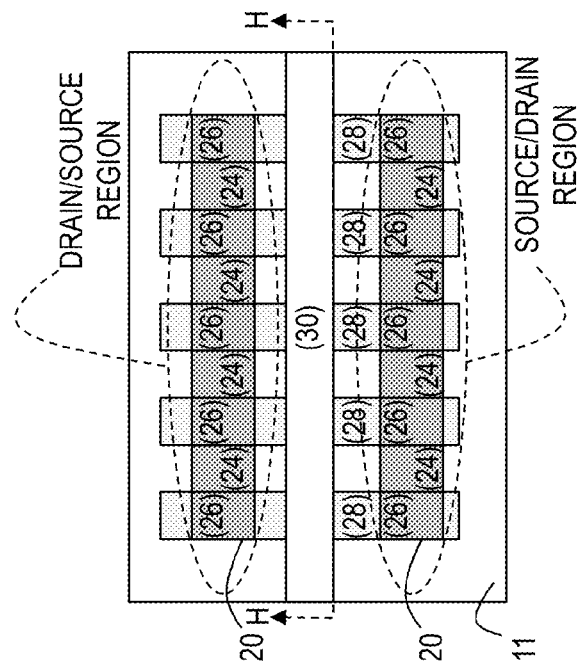
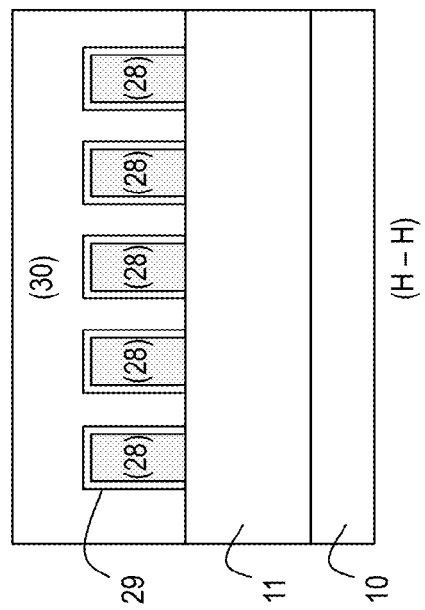
Fig. 7

METHOD FOR FORMING AND STRUCTURE OF A RECESSED SOURCE/DRAIN STRAP FOR A MUGFET

CROSS-REFERENCE TO RELATED APPLICATIONS

This application is a divisional of U.S. patent application Ser. No. 12/876,343, filed Sep. 7, 2010, the complete disclosure of which is incorporated herein by reference.

BACKGROUND

The present invention generally relates to spacers for FETs (Field Effect Transistors) and more particularly to the formation of a recessed source/drain strap for a MUGFET (Multi-Gate FET).

As the end of linear scaling of planar complementary metal oxide semiconductors (CMOS) approaches, alternative device structures are being evaluated. One of the primary candidates is FINFET (Fin Field Effect Transistor) technology, where a thin fin, or pillar of silicon is created using sub-lithographic techniques, thereby allowing placement of the gate on sides of the fin, which in the "on" state, fully depletes the silicon in the fin, making it a high performance device.

The term FINFET generally refers to a nonplanar, double-gate transistor. Integrated circuits that include INFETs may be fabricated on a bulk silicon substrate or, more commonly, on a silicon-on-insulator (SOI) wafer that includes an active SOI layer of a single crystal semiconductor, such as silicon, a substrate, and a buried insulator layer, e.g., a buried oxide layer that separates and electrically isolates the substrate from the semiconductor layer. Each FINFET generally includes a narrow vertical fin body of single crystal semiconductor material with vertically-projecting sidewalls. A gate contact or electrode intersects a channel region of the fin body and is isolated electrically from the fin body by a thin gate dielectric layer. At opposite ends of the fin body are heavily-doped source/drain regions.

A multi-gate device or Multi-gate Field Effect Transistor (MUGFET) refers to a MOSFET that incorporates more than one gate into a single device. The multiple gates may be controlled by a single gate electrode, wherein the multiple gate surfaces act electrically as a single gate, or by independent gate electrodes.

In a multi-gate device, the channel is surrounded by several gates on multiple surfaces, allowing more effective suppression of "off-state" leakage current. Multiple gates also allow enhanced current in the "on" state, also known as drive current. These advantages translate to lower power consumption and enhanced device performance. Nonplanar devices are also more compact than conventional planar transistors, enabling higher transistor density, which translates to smaller overall microelectronics.

In a conventional fabrication process of a MUGFET, it is desirable to provide for electrical connection to one or more fins from a wiring level to the transistor. In particular, such connections are prone to the introduction of added (series) resistances to source and drain as well as added parasitic capacitance from gate to source and gate to drain. It is, therefore, further desirable to provide electrical connections to one or more fins in a manner that introduces minimal added series resistance and minimal added gate-to-source and gate-to-drain capacitances. A large contact area of metal silicide to highly doped regions (source and drain) of the fins is needed to attain low resistance; prior-art structures introduced to add such area have also added significantly to the capacitance between the gate and the low-resistance structures.

The purpose of the strap is to form a conductive region between the FINFETs that is both low in resistance and low in capacitance. A conductive strap recessed below the surface plane of the FINFETs limits the capacitance between the conductive strap and the gate at very low levels. A conductive strap that is planar with the fins (that shorts the ends together) has a very high capacitance to the gate region. This gate to strap capacitance results in a switching speed delay and higher power.

SUMMARY

An exemplary aspect of an embodiment herein includes a semiconductor structure that includes an insulator layer on a substrate, and a plurality of parallel fins above the insulator layer, relative to a bottom of the structure. Each of the fins comprises a central semiconductor portion and conductive end portions. At least one conductive strap may be positioned within the insulator layer below the fins, relative to the bottom of the structure. The conductive strap can be perpendicular to the fins and contact the fins. The conductive strap further includes recessed portions disposed within the insulator layer, below the plurality of fins, relative to the bottom of the structure, and between each of the plurality of fins, and projected portions disposed above the insulator layer, collinear with each of the plurality of fins, relative to the bottom of the structure. The conductive strap is disposed in at least one of a source and a drain region of the semiconductor structure. A gate insulator contacts and covers the central semiconductor portion of the fins, and a gate conductor covers and contacts the gate insulator.

Another exemplary aspect of an embodiment of herein includes a semiconductor structure includes an insulator layer on a substrate, and a plurality of parallel fins above the insulator layer, relative to a bottom of the semiconductor structure. Each of the fins includes a central semiconductor portion and conductive end portion, at least one conductive strap positioned within the insulator layer below the fins, relative to the bottom of the structure, the conductive strap being perpendicular to the fins and electrically connects and contacts the fins. The conductive strap produces physical strain within the central semiconductor portion of the fins, the at least one conductive strap includes recessed portions disposed within the insulator layer, below the plurality of parallel fins, relative to the bottom of the structure, and between each of the plurality of parallel fins. Projected portions extend into the fins, collinear with each of the plurality of parallel fins, relative to the bottom of the structure. A gate dielectric contacts and covers the central semiconductor portion of the fins, and a gate conductor covers and contacts the gate dielectric, wherein the at least one conductive strap electrically connects and contacts the fins. The at least one conductive strap produces a physical strain within the central semiconductor portion of the plurality of parallel fins, and the conductive strap is disposed in at least one of a source and a drain region of the semiconductor structure.

Another exemplary aspect of an embodiment of herein includes a method for creating a semiconductor structure by providing an insulator layer on a substrate, patterning the insulator layer to form at least one recess in the insulator layer, forming at least one conductive strap within the recess in the insulator layer, and patterning a plurality of parallel fins above the insulator layer, relative to a bottom of the structure. Each of the fins including a central semiconductor portion and conductive end portions, where the conductive strap is positioned within the insulator layer below the fins, relative to the bottom of the structure, and is perpendicular to the fins and contacts the fins. The conductive strap includes projected portions extending into the fins, collinear with each of the plurality of fins, relative to the bottom of the structure, forming a gate dielectric contacting and covering the central semiconductor portion of the fins. A gate conductor is formed covering and contacting the gate dielectric, wherein the conductive strap is disposed in at least one of a source and a drain region of the semiconductor structure.

Another exemplary aspect of an embodiment of herein includes a method for creating a semiconductor structure by providing an insulator layer on a substrate, patterning the insulator layer to form at least one recess in the insulator layer, forming at least one conductive strap within the recess in the insulator layer, and patterning a plurality of parallel fins above the insulator layer, relative to a bottom of the structure. Each of the fins including a central semiconductor portion and conductive end portions, the conductive strap being positioned within the insulator layer below the fins, relative to the bottom of the structure. The conductive strap is perpendicular to the fins and contacting the fins, and the conductive strap includes projected portions extending into the fins, collinear with each of the plurality of fins, relative to the bottom of the structure. A gate dielectric is formed contacting and covering the central semiconductor portion of the fins, and forming a gate conductor covering and contacting the gate dielectric. The conductive strap is disposed in at least one of a source and a drain region of the semiconductor structure, wherein the one conductive strap produces a physical strain within the central semiconductor portion of the plurality of parallel fins. The conductive strap is disposed in at least one of a source and a drain region of the semiconductor structure.

With these features, the embodiments herein provide a source/drain strap that allows for a low capacitance connection between semiconductor fins, and the strap also provides for a large amount of silicide to contact area.

BRIEF DESCRIPTION OF THE DRAWINGS

The foregoing and other exemplary purposes, aspects and advantages will be better understood from the following detailed description of an exemplary embodiment herein with reference to the drawings, in which:

FIG. 4 is a side-view schematic diagram that shows a fabrication process for forming a first semiconductor structure, in accordance with embodiments herein;

FIG. 5A is a side-view schematic diagram that shows a fabrication process for forming a first semiconductor structure, in accordance with embodiments herein;

FIG. 5B is a side-view schematic diagram that shows an alternative view of the fabrication process of FIG. 5A for forming a first semiconductor structure, in accordance with embodiments herein;

FIG. 6 is a perspective-view schematic diagram that shows an alternative perspective view of the fabrication process of FIG. 5 for forming a first semiconductor structure, in accordance with embodiments herein;

FIG. 7 is a side-view schematic diagram that shows a fabrication process for forming a first semiconductor structure, in accordance with embodiments herein.

DETAILED DESCRIPTION

Figures 1, 2, 3:
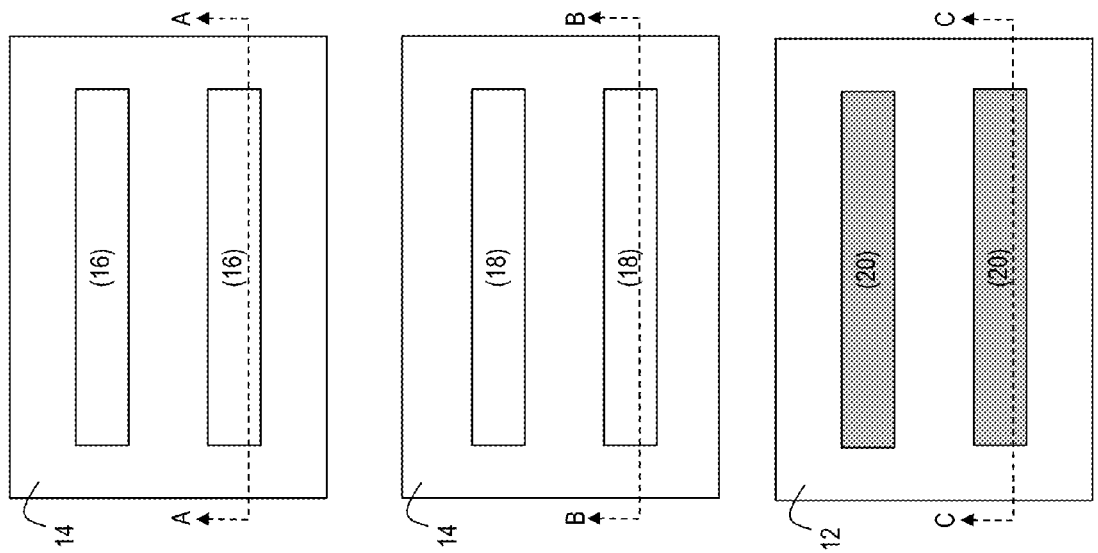
FIG. 1 is a side-view schematic diagram that shows a fabrication process for forming a first semiconductor structure, in accordance with embodiments herein.
FIG. 2 is a side-view schematic diagram that shows a fabrication process for forming a first semiconductor structure, in accordance with embodiments herein.
FIG. 3 is a side-view schematic diagram that shows a fabrication process for forming a first semiconductor structure, in accordance with embodiments herein.

Referring now to the drawings, and more particularly to FIGS. 1-8, there are shown exemplary embodiments of the method and structures herein.

FIG. 1 illustrates an embodiment herein having a starting silicon-on-insulator structure that includes a Si layer 12 formed on an insulator layer 11 on a BOX 10 (buried oxide) substrate. A nitride hardmask 14 is formed over the Si layer 12. The Si layer 12 and nitride hardmask 14 are formed in conventional processes. For example, a Si layer 12 may be bonded to insulator layer 11, and the nitride hardmask 14 may be deposited on the Si layer 12, respectively. The nitride hardmask 14 may then be patterned, and etched using RIE (reactive ion etch) processes to form the nitride hardmask 14 having a mask opening 16, which is subsequently used to form a trench 18 in the Si layer 12.

FIG. 2 illustrates an embodiment of the invention immediately after an etching process where the mask opening 16 enables an etchant to form a trench 18 through the Si layer 12 and into insulator layer 11.

FIG. 3 illustrates an embodiment of the invention where polysilicon material is deposited into the trench 18 to form a conductive polysilicon strap 20, and after forming the polysilicon material in the trench 18, a planarization step removes the material deposited on the top to be planar with the rest of the surface of the Si layer 12. Additionally, the nitride hardmask 14 is removed through a planarization step so that the Si layer 12 remains. In one embodiment of the invention, the conductive polysilicon strap 20 provide a compressive or tensile strain into the channel based on the type of material deposited and/or the method of depositing the material into the trench 18. Another embodiment of the invention may grow selective silicon on the conductive polysilicon strap 20, or in another embodiment, the conductive polysilicon strap 20 may be silicided.

FIG. 4 illustrates an embodiment of invention where a second mask layer 22 is applied to the upper surface of the Si layer 12 and the upper surface of the conductive polysilicon strap 20. The second mask layer 22 includes polysilicon strap mask patterns 22A that allow an etchant to edge selected portions of the conductive polysilicon strap 20 below the upper surface of the Si layer 12 and into the insulator layer 11.

FIGS. 5A, 5B, and 6 illustrate an embodiment herein where semiconductor fins 28 may be etched simultaneously, or independently of the masking and etching process of the conductive polysilicon strap 20. FIG. 5A illustrates the conductive polysilicon strap 20 having strap recesses 24 formed below an upper surface of the insulator layer 11 at a depth "D", and an upper portion 26 of the conductive polysilicon strap 20 forming teeth like protrusions that extend into the semiconductor fins 28. FIGS. 5A and 5B illustrate the semiconductor fins 28 formed by a second mask layer 22 or an additional mask layer (not shown) that include a central semiconductor portion 28A, and distal conductive end portions 28B opposite this central semiconductor portion 28A. The conductive polysilicon strap 20 thereby forms an electrical connection between the aligned semiconductor fins 28. The conductive polysilicon strap 20 actually makes up a portion of the semiconductor fins 28 and, therefore, may induce a compressive or tensile stress on the semiconductor fins 28 depending on the type of material and process of formation of the conductive polysilicon strap 20.

FIG. 6 also illustrates a Source/Drain region of the semiconductor located at the distal end portions 28B of the semiconductor fins 28. This region is where the conductive polysilicon strap 20 is located underneath the semiconductor fins 28. A silicide (not shown) may be formed on the Source/Drain regions of the semiconductor fins 28, which may extend onto the conductive polysilicon strap(s) 20.

FIG. 7 illustrates an embodiment herein where a gate dielectric material 29 is deposited to cover the semiconductor fins 28 to a thickness between 10 to 30 angstroms, formed through thermal or chemical deposition. A gate conductor 30 is formed through masking, depositing the gate conductor material and etching the same, such that the gate conductor 30 is formed over the gate dielectric material 29 and the central semiconductor portions 28A of semiconductors fins 28.

Figure 8:
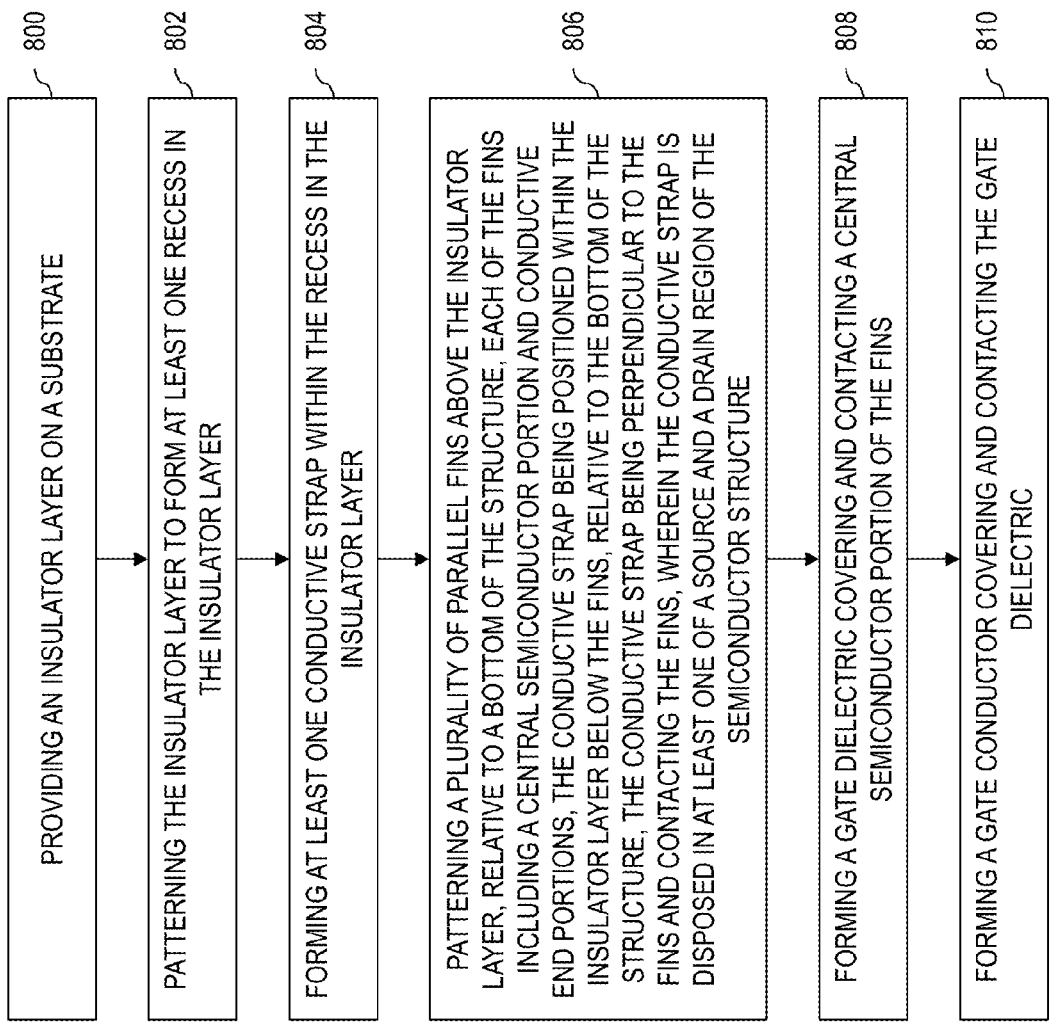
FIG. 8 is a logic flowchart diagram for forming a first semiconductor structure, in accordance with embodiments herein.

FIG. 8 illustrates a logic flow diagram of a method of fabrication of one embodiment herein. The process provides an insulator layer on a substrate 800, and subsequently patterns and etches the insulator layer to form at least one recess in the insulator layer 802. Material is then deposited forming at least one conductive strap within the recess in the insulator layer 804. At 806, a plurality of parallel fins is patterned above the insulator layer, relative to the bottom of the structure, wherein each of the fins comprises a central semiconductor portion and conductive end portions. The conductive strap may be positioned within the insulator layer below the fins, relative to the bottom of the structure; the conductive strap is perpendicular to the fins and contacts the fins. The conductive strap is disposed in the source and/or drain region of the semiconductor structure. A gate dielectric may be formed 808 contacting and covering the central semiconductor portion of the fins. Thereafter, a gate conductor is formed 810 covering and contacting the gate dielectric.

With its features, one or more embodiments herein provide a source/drain strap that allows a low capacitance connection between semiconductor fins, wherein the strap also provides for a large amount of silicide to contact area.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of any embodiments herein. As used herein, the singular forms 'a', 'an', and 'the' are intended to include the plural forms as well, unless the context clearly indicates otherwise. It will be further understood that the terms 'comprises' and/or 'comprising,' when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments herein has been presented for purposes of illustration and description, but is not intended to be exhaustive or limited to the embodiments herein in the form disclosed. Many modifications and variations will be apparent to those of ordinary skill in the art without departing from the scope and spirit of the embodiments herein. The embodiment was chosen and described in order to best explain the principles of the embodiments herein and the practical application, and to enable others of ordinary skill in the art to understand the embodiments herein for various embodiments with various modifications as are suited to the particular use contemplated.

What is claimed is:

1. A method of creating a semiconductor structure comprising:
   providing an insulator layer on a substrate;
   patterning said insulator layer to form at least one recess in said insulator layer;
   forming at least one conductive strap within said at least one recess in said insulator layer;
   patterning a plurality of fins above said insulator layer, relative to a bottom of said semiconductor structure, each of said fins comprising a central semiconductor portion and conductive end portions, said at least one conductive strap being positioned within said insulator layer below said plurality of fins, relative to said bottom of said semiconductor structure, said plurality of fins being parallel to each other, and said at least one conductive strap being perpendicular to said fins and contacting said fins, and said at least one conductive strap comprising projected portions extending into said fins, collinear with each of said plurality of fins, relative to said bottom of said semiconductor structure;
   forming a gate dielectric contacting and covering said central semiconductor portion of said plurality of fins; and
   forming a gate conductor contacting and covering said gate dielectric,
   said at least one conductive strap being disposed in at least one of a source region and a drain region of said semiconductor structure.

2. The method of creating a semiconductor structure according to claim 1, said forming said at least one conductive strap comprising depositing in said recess one of a silicon component and a metal.

3. The method of creating a semiconductor structure according to claim 1, further comprising siliciding at least a portion of said at least one conductive strap.

4. The method of creating a semiconductor structure according to claim 1, each of said plurality of fins having a height, width, and length, said patterning said plurality of fins comprising forming said height to be greater than said width and said length to be greater than said height.

5. The method of creating a semiconductor structure according to claim 1, said conductive end portions of said fins comprising said source regions and said drain regions of said fins.

6. A method of creating a semiconductor structure comprising:
provproviding an insulator layer on a substrate;
patterning said insulator layer to form at least one recess in said insulator layer;
forming at least one conductive strap within said at least one recess in said insulator layer;
patterning a plurality of fins above said insulator layer, relative to a bottom of said semiconductor structure, each of said fins comprising a central semiconductor portion and conductive end portions,
said at least one conductive strap being positioned within said insulator layer below said fins, relative to said bottom of said semiconductor structure,
said plurality of fins being parallel to each other and said at least one conductive strap being perpendicular to said fins and contacting said fins, and
said at least one conductive strap comprising projected portions extending into said fins, collinear with each of said plurality of fins, relative to said bottom of said semiconductor structure;
forming a gate dielectric contacting and covering said central semiconductor portion of said plurality of fins; and
forming a gate conductor contacting and covering said gate dielectric,
said at least one conductive strap electrically contacting and connecting said fins,
said at least one conductive strap producing a physical strain within said central semiconductor portion of said plurality of fins, and
said at least one conductive strap being disposed in at least one of a source region and a drain region of said semiconductor structure.

7. The method of creating a semiconductor structure according to claim 6, said forming said at least one conductive strap comprising depositing in said recess one of a silicon component and a metal.

8. The method of creating a semiconductor structure according to claim 6, further comprising siliciding at least a portion of said at least one conductive strap.

9. The method of creating a semiconductor structure according to claim 6, each of said plurality of fins having a height, width, and length, said patterning said plurality of fins comprising forming said height to be greater than said width and said length to be greater than said height.

10. The method of creating a semiconductor structure according to claim 6, said conductive end portions of said fins comprising said source regions and said drain regions of said fins.

11. A method comprising:
providing a silicon-on-insulator (SOI) structure comprising a silicon layer formed on an insulator layer formed on a buried oxide substrate;
patterning said SOI structure to form at least one recess through said silicon layer and at least partially into said insulator layer;
forming a conductive strap within said at least one recess;
patterning a plurality of fins above said SOI structure, relative to a bottom of said SOI structure, each of said fins comprising a central semiconductor portion and conductive end portions,
said conductive strap being positioned within said insulator layer below said plurality of fins, relative to said bottom of said SOI structure,
said plurality of fins being parallel to each other, and said conductive strap being perpendicular to said fins and contacting said fins, and
said conductive strap comprising projected portions extending into said fins, collinear with each of said plurality of fins, relative to said bottom of said SOI structure;
forming a gate dielectric on at least a portion of said plurality of fins, said gate dielectric contacting and covering said central semiconductor portion of said plurality of fins; and
forming a gate conductor on said gate dielectric, said gate conductor contacting and covering said gate dielectric,
said conductive strap being disposed in at least one of a source region and a drain region of said SOI structure.

12. The method according to claim 11, said forming of said conductive strap comprising depositing in said recess one of a silicon component and a metal.

13. The method of claim 11, further comprising siliciding at least a portion of said conductive strap.

14. The method according to claim 11, each of said plurality of fins having a height, width, and length, said patterning said plurality of fins comprising forming said height to be greater than said width and said length to be greater than said height.

15. The method according to claim 11, said conductive end portions of said fins comprising source regions and drain regions of a field effect transistor.

16. A method comprising:
providing a silicon-on-insulator (SOI) structure comprising a silicon layer formed on an insulator layer formed on a buried oxide substrate;
patterning said SOI structure to form at least one recess through said silicon layer and at least partially into said insulator layer;
forming a conductive strap within said at least one recess;
patterning a plurality of fins above said SOI structure, relative to a bottom of said SOI structure, each of said fins comprising a central semiconductor portion and conductive end portions,
said conductive strap being positioned within said insulator layer below said plurality of fins, relative to said bottom of said SOI structure,
said plurality of fins being parallel to each other, and said conductive strap being perpendicular to said fins and contacting said fins, and
said conductive strap comprising projected portions extending into said fins, collinear with each of said plurality of fins, relative to said bottom of said SOI structure;
forming a gate dielectric on at least a portion of said plurality of fins, said gate dielectric contacting and covering said central semiconductor portion of said plurality of fins; and
forming a gate conductor on said gate dielectric, said gate conductor contacting and covering said gate dielectric,
said conductive strap electrically contacting and connecting said fins,
said conductive strap producing a physical strain within said central semiconductor portion of said plurality of fins, and
said conductive strap being disposed in at least one of a source region and a drain region of said SOI structure.

17. The method according to claim 16, said forming of said conductive strap comprising depositing in said recess one of a silicon component and a metal.

18. The method of claim 16, further comprising siliciding at least a portion of said conductive strap.

19. The method according to claim 16, each of said plurality of fins having a height, width, and length, said patterning said plurality of fins comprising forming said height to be greater than said width and said length to be greater than said height.

20. The method according to claim 16, said conductive end portions of said fins comprising source regions and drain regions of a field effect transistor.

* * * * *